United States Patent
Yamaoka et al.

(10) Patent No.: US 9,438,187 B2
(45) Date of Patent: Sep. 6, 2016

(54) AMPLIFYING DEVICE, TRANSMITTING DEVICE

(71) Applicant: KABUSHIKI KAISHA TOSHIBA, Tokyo (JP)

(72) Inventors: Atsushi Yamaoka, Kawasaki (JP); Keiichi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/328,140

(22) Filed: Jul. 10, 2014

(65) Prior Publication Data

US 2015/0017934 A1 Jan. 15, 2015

(30) Foreign Application Priority Data

Jul. 11, 2013 (JP) .................................. 2013-145695

(51) Int. Cl.
*H04B 1/04* (2006.01)
*H03F 3/28* (2006.01)
*H04K 1/02* (2006.01)
*H03F 3/24* (2006.01)
*H03F 1/02* (2006.01)

(52) U.S. Cl.
CPC ............ *H03F 3/245* (2013.01); *H03F 1/0261* (2013.01); *H03F 1/0288* (2013.01); *H04B 1/0458* (2013.01); *H04B 1/0483* (2013.01); *H03F 2200/423* (2013.01); *H03F 2203/21139* (2013.01)

(58) Field of Classification Search
CPC ..... H04B 1/0483; H04B 1/40; H03F 1/0288; H03F 3/211; H03F 2200/387; H03F 2200/451
USPC ....... 455/114.1, 114.2, 114.3, 127.2; 330/84, 330/124 R, 126, 295; 375/296, 297
See application file for complete search history.

(56) References Cited

U.S. PATENT DOCUMENTS

| | | | | |
|---|---|---|---|---|
| 6,128,479 A | * | 10/2000 | Fitzpatrick | ............... H03F 1/565 330/295 |
| 7,847,630 B2 | * | 12/2010 | Okubo | ................... H03F 1/0288 330/124 R |
| 8,593,219 B1 | * | 11/2013 | Root | ..................... H03F 1/0288 330/124 R |
| 2012/0025916 A1 | | 2/2012 | Deguchi | |
| 2015/0119107 A1 | * | 4/2015 | Bouny | .................. H03F 1/0288 330/295 |

FOREIGN PATENT DOCUMENTS

JP 2012-034134 2/2012

OTHER PUBLICATIONS

Kwon et al.; "Inverted-Load Network for High-Power Doherty Amplifier", IEEE Microwave Magazine, pp. 93-98, (2009).

* cited by examiner

Primary Examiner — Quochien B Vuong
(74) Attorney, Agent, or Firm — Finnegan, Henderson, Farabow, Garrett & Dunner LLP

(57) ABSTRACT

An amplifying device of an embodiment includes: a first amplifier amplifying a first component of an input signal; a first output circuit having an input connected to an output of the first amplifier and converting impedance seen from an output of the first output circuit to make the converted impedance seen from the first amplifier; a second amplifier amplifying a second component of the input signal with a bias deeper than that of the first amplifier; a second output circuit having an input connected to an output of the second amplifier, having a longer electrical length than that of the first output circuit part, and converting impedance seen from an output of the second output circuit to make the converted impedance seen from the second amplifier; and a combiner combining the first component amplified by the first amplifier and the second component amplified by the second amplifier.

18 Claims, 4 Drawing Sheets

AMPLIFYING DEVICE, TRANSMITTING DEVICE

CROSS REFERENCE TO RELATED APPLICATION

This application is based upon and claims the benefit of priority from Japanese Patent Application No. 2013-145695, filed on Jul. 11, 2013; the entire contents of which are incorporated herein by reference.

Field

Embodiments described herein relate generally to an amplifying device and a transmitting device.

BACKGROUND

As a high-efficiency amplifier, a Doherty amplifier has been known, for instance. The Doherty amplifier generally has two amplifiers, a carrier amplifier and a peaking amplifier, out of which the carrier amplifier is biased to operate in class A or class AB and the peaking amplifier is biased to operate in class C. That is, a bias of the peaking amplifier is set deeper than a bias of the carrier amplifier. Further, the Doherty amplifier includes, at a carrier amplifier output, a transmission line having a 90 degree ($\lambda/4$) electrical length in terms of carrier frequency, and by load modulation, it realizes a high-efficiency operation over a wide output power.

On the other hand, for a signal with a frequency different from the frequency corresponding to the transmission line connected to the carrier amplifier output, the operation of the amplifier falls out of a desired characteristic. That is, a wide band operation of the whole amplifier has been difficult.

DETAILED DESCRIPTION

As described above, the structure of the conventional Doherty amplifier has a problem of a difficulty in obtaining high efficiency over a wide band. Embodiments relate to an amplifying device using a plurality of amplifiers and have an object to provide an amplifying device and a transmitting device which realize a high-efficiency operation over a wide band.

An amplifying device of an embodiment includes: a first amplifier which amplifies a first signal component of an input signal; and a first output circuit which has an input connected to an output of the first amplifier and converts an impedance seen from an output of the first output circuit to make the converted impedance seen from the first amplifier. Further, the amplifying device of the embodiment includes: a second amplifier which amplifies a second signal component of the input signal with a bias deeper than a bias of the first amplifier; and a second output circuit which has an input connected to an output of the second amplifier, has a longer electrical length than an electric length of the first output circuit, and converts an impedance seen from an output of the second output circuit to make the converted impedance seen from the second amplifier. Further, the amplifying device of the embodiment includes a combiner which combines the first signal component amplified by the first amplifier and the second signal component amplified by the second amplifier.

(First Embodiment)

Figure 1:
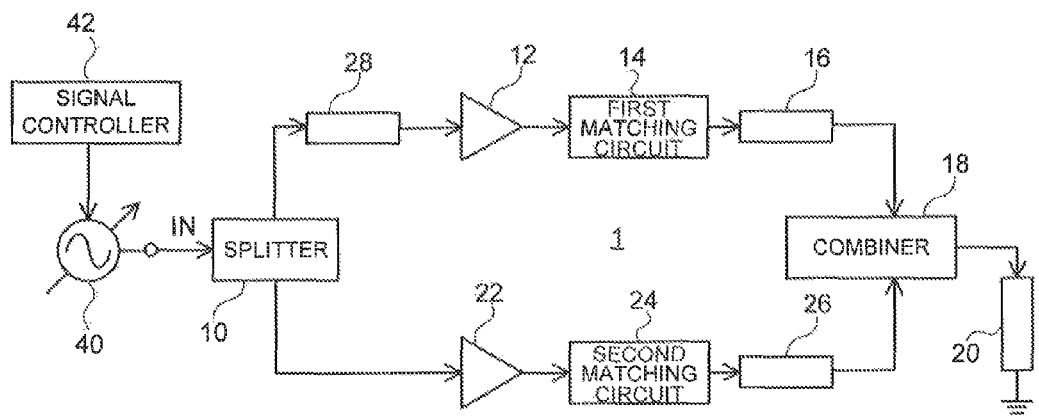
FIG. 1 is a block diagram illustrating the structure of an amplifying device according to a first embodiment.

Hereinafter, an embodiment will be described in detail with reference to the drawings. As illustrated in FIG. 1, an amplifying device 1 of this embodiment forms a Doherty amplifier including: a splitter 10 which splits an input signal; a first amplifier 12 and a second amplifier 22 which amplify signal components into which the input signal is split by the splitter 10 respectively; and a combiner 18 which synthesizes amplified signals resulting from the amplification by the first amplifier 12 and the second amplifier 22.

Between an output of the first amplifier 12 and an input of the combiner 18, a first matching circuit 14 which subjects the output of the first amplifier 12 to matching and a first output circuit 16 which converts an output impedance of the first matching circuit 14 are connected in series. Similarly, between an output of the second amplifier 22 and an input of the combiner 18, a second matching circuit 24 which subjects the output of the second amplifier 22 to matching and a second output circuit 26 which converts an output impedance of the second matching circuit 24 are connected in series.

Between an output of the splitter 10 and an input of the first amplifier 12, a transmission line 28 is connected. Further, a load 20 is connected to an output of the combiner 18. In this embodiment, "active load pull" is realized, which is a technique to change impedances when the combiner 18 side is seen from the first and second amplifiers 12, 22, according to levels of output signals of the first and second amplifiers 12, 22.

The splitter 10 distributes the input signal given to an input IN to a route to the first amplifier 12 and a route to the second amplifier 22. That is, the splitter 10 splits the input signal into the plural signal components. The splitter 10 can be realized by, for example, a hybrid circuit. One of the two outputs of the splitter 10 is connected to the input of the first amplifier 12 via the transmission line 28, and the other output is connected to an input of the second amplifier 22.

The first amplifier 12 and the second amplifier 22 are a carrier amplifier and a peaking amplifier respectively in the Doherty amplifier. That is, the first amplifier 12 constantly operates irrespective of an amplitude of the input signal, while the second amplifier 22 operates only when the amplitude of the input signal is over a predetermined value. The first amplifier 12 and the second amplifier 22 have different operating points (for example, different gate bias values) respectively, and the gate bias value of the second amplifier 22 is set deeper than the gate bias value of the first amplifier 12. For example, the first amplifier 12 operates in class B and the second amplifier 22 operates in class C.

Using the deep bias indicates that the amplifier does not operate with a low input power and operates with a high input power. Therefore, regarding the first and second amplifiers 12, 22, the second amplifier 22 only need to start its operation with a higher input power, and the operating classes of the first and second amplifiers 12, 22 may be practically any. Further, since amplifiers different in operating class generally have a problem of different gains, a structure for equalizing the gains of the first and second amplifiers 12, 22 may be provided. The first and second amplifiers 12, 22 can have a structure of a commonly used amplifier such as a push-pull amplifier, a balanced amplifier, or the like. Further a multi-stage structure or a multi parallel structure may be adopted. In the description below, the "operating point" means a concept including the operating class, the bias of the amplifier, a gate voltage and a drain voltage of an amplifying element.

The first matching circuit 14 and the second matching circuit 24 ideally have characteristics of reflecting harmonics appearing in the outputs of the amplified signals of the first amplifier 12 and the second amplifier 22. However, when the harmonics are processed inside the first amplifier 12 and the second amplifier 22, or when an output for harmonic component termination is provided in a package of each amplifier, the harmonics do not sometimes appear in the outputs of the amplified signals. Further, the first matching circuit 14 and the second matching circuit 24 have characteristics of capable of matching in a relatively wide frequency band. For example, the first matching circuit 14 and the second matching circuit 24 preferably have characteristics so that a fractional bandwidth becomes 1% or more, and more preferably have characteristics so that a fractional bandwidth becomes 20% or more.

The first output circuit 16 and the second output circuit 26 are circuits realizing impedance conversion, and are, for example, circuits each having one circuit element or more such as a transmission line, an LC circuit, and a tapered line.

The first output circuit 16 has an impedance converting function of converting an impedance when the combiner 18 is seen from the first output circuit 16 to make the converted impedance seen from the first amplifier 12. Similarly, the second output circuit 26 has an impedance converting function of converting an impedance when the combiner 18 is seen from the second output circuit 26 to make the converted impedance seen from the second amplifier 22.

The Doherty amplifier realizes high power efficiency by using the active load pull technique which makes impedances seen from the respective amplifiers appear to be dynamically changing by supplying powers from a plurality of amplifiers to a load at the same time.

Figure 2:
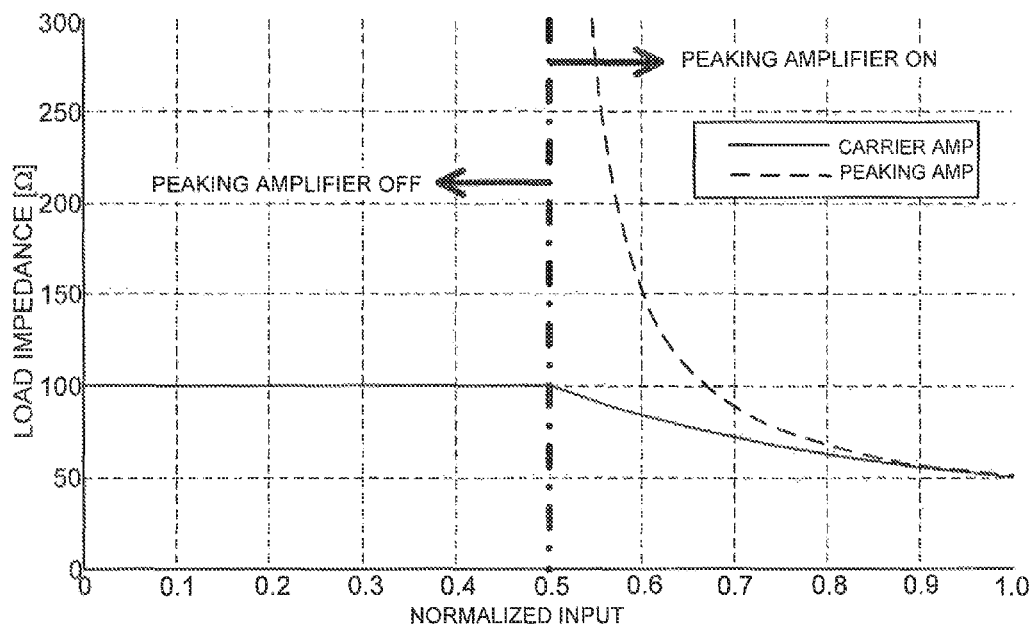
FIG. 2 is a chart illustrating characteristics of a first and a second output circuit according to the embodiment.

The example represented by the solid line in FIG. 2 illustrates how an impedance seen from the output of the first amplifier 12 changes. It is assumed that an impedance of the load 20 is 25Ω, and the output circuits 16, 26 are transmission lines whose electrical lengths are 90 degrees and 180 degrees respectively and whose characteristic impedances are 50Ω. When the second amplifier 22 is not operating, the first output circuit 16 converts the load seen from the first amplifier 12 to 100Ω. When the second amplifier 22 operates, an impedance when the combiner 18 is seen from an output end of the first output circuit 16 increases due to the active load pull, and when an output power of the second amplifier 22 reaches saturation, the impedance when the combiner 18 is seen from the output end of the first output circuit 16 becomes 50Ω. Therefore, the impedance when the output circuit 16 is seen from the first amplifier 12 becomes 50Ω.

On the other hand, the example represented by the broken line in FIG. 2 illustrates how an impedance seen from the output of the second amplifier 22 changes under the same condition as that for the solid line part. When the second amplifier 22 is not operating, the input impedance of the second output circuit 26 seen from the second amplifier 22 becomes a sufficiently high impedance. That is, the output of the second amplifier 22 becomes open. When the second amplifier 22 operates, an impedance when the combiner 18 is seen from the output of the second output circuit 26 reduces due to the active load pull. When the output power of the second amplifier 22 reaches saturation, the impedance when the combiner 18 is seen from the output end of the second output circuit 26 becomes 50Ω. Therefore, the impedance when the output circuit 26 is seen from the second amplifier 2 becomes 50Ω.

Note that the first output circuit 16 and the second output circuit 26 have different electrical lengths. For example, the electrical length of the carrier amplifier side is set shorter than the electrical length of the peaking amplifier side so that the electrical length of the first output circuit 16 becomes 90 degrees ($\lambda/4$, where $\lambda$ is a wavelength of the signal) and the electrical length of the second output circuit 26 becomes 180 degrees ($\lambda/2$). Here, the "electrical length" is a length corresponding to the wavelength of the signal that the amplifying device 1 amplifies, and the aforesaid electrical lengths of the first output circuit 16 and the second output circuit 26 are concretely defined as lengths from virtual power sources in intrinsic regions of the amplifying elements in the first and second amplifiers 12, 22 up to a phase reference point inside the combiner 18. The first output circuit 16 and the second output circuit 26 are necessary for obtaining the effect of the active load pull.

Generally, an output circuit used in a Doherty amplifier is realized by a $\lambda/4$ line, but what is important is the electrical length, and provided that this electrical length is realized, any structure may be adopted. For example, the first and second output circuits 16, 26 may be formed by dividing a transmission line into two and providing an LC circuit therebetween. Further, the transmission lines forming the first and second output circuits 16, 26 need not be formed by lines having a single characteristic impedance. When necessary, the first and second output circuits 16, 26 may be formed by combining transmission lines having different characteristic impedances.

The first and second output circuits 16, 26 can be realized by the transmission lines and an LC 90-degree phase shift circuit. Incidentally, when the combiner 18 is realized by a transformer, the transformer can also be used as the output circuit. In this case, the aforesaid "electrical length" is read as "phase difference".

The combiner 18 synthesizes powers of the amplified signal resulting from the amplification by the first amplifier 12 and the amplified signal resulting from the amplification by the second amplifier 22. Concretely, the combiner 18 synthesizes the amplified signal output from the first output circuit 16 and the amplified signal output from the second output circuit 26 to give the synthesized signal to the load 20. The combiner 18 can be realized by a T-branch circuit, a transformer, a hybrid circuit, or the like besides the structure to which the outputs of the first amplifier 12 and the second amplifier 22 are connected as they are. In the T branch circuit, since a shunt capacitance is added, its influence is taken into consideration in designing the first output circuit 16 and the second output circuit 26.

The transmission line 28 is a delay line for cancelling a difference between an electrical length of the route from the input of the splitter 10 to the output of the combiner 18 through the first amplifier 12, the first matching circuit 14, and the first output circuit 16 and an electrical length of the route from the input of the splitter 10 to the output of the combiner 18 through the second amplifier 22, the second matching circuit 24, and the second output circuit 26. The transmission line 28 may be provided on an input side of the second amplifier 22 instead of the input side of the first amplifier 12 according to the difference between the electrical lengths of the respective routes. Alternatively, the transmission lines 28 may be provided on the input sides of the first and second amplifiers 12, 22 respectively. In the example illustrated in FIG. 1, it is disposed between the splitter 10 and the first amplifier 12.

The load 20 is a load of the amplifying device 1, and in the example illustrated in FIG. 1, it is connected between the output of the combiner 18 and the ground. The load 20 is not limited to the structure terminating the output of the amplifying device 1 as illustrated in FIG. 1, but may have a structure to convert an impedance in a $\lambda/4$ line to output the resultant. In this case, the $\lambda/4$ line may have a multi-stage structure. Further, outputs of a plurality of amplifying devices may be synthesized, and a combiner may be included.

The amplifying device 1 of this embodiment can form a transmitting device by receiving a signal to be amplified such as a modulating signal at the input IN. For example, as illustrated in FIG. 1, by farther providing a signal generator 40 and a signal controller 42 which controls a frequency of a signal generated by the signal generator 40, and by providing an antenna or a power feeder as the load 20, it is possible to form the transmitting device.

Here, the signal generator 40 is an oscillator capable of controlling the frequency and gives the signal to be amplified to the input IN. The signal controller 42 controls the frequency of the signal generated by the signal generator 40.

As previously described, on the output side of the carrier amplifier, the Doherty amplifier generally includes the transmission line having the 90-degree electrical length in terms of the carrier frequency to be amplified. Since a frequency bandwidth usable by the transmission line is generally narrow, it is difficult to realize a wide-band amplifying operation in an amplifying device including a transmission line on an output side. In the amplifying device of this embodiment, since the first output circuit 16 and the second output circuit 26 having the characteristics illustrated in FIG. 2 are provided on the output sides of the carrier amplifier and the peaking amplifier respectively, an efficient operation is possible over a wide band as compared with a conventional Doherty amplifier.

Further, in the amplifying device of this embodiment, since the wide-band matching circuits are disposed on the output sides of the carrier amplifier and the peaking amplifier respectively, the wider-band operation can be realized. For example, when circuits satisfying a 20% fractional bandwidth or more are provided as the first and second matching circuits, a high-efficiency operation is especially possible over a wide band. Note that the characteristics of the matching circuits are not limited to the 20% fractional bandwidth or more. For example, even when the fractional bandwidth of the matching circuits is 1% or more, a certain effect can be obtained.

(Operation Example of First Embodiment)

Figure 3:
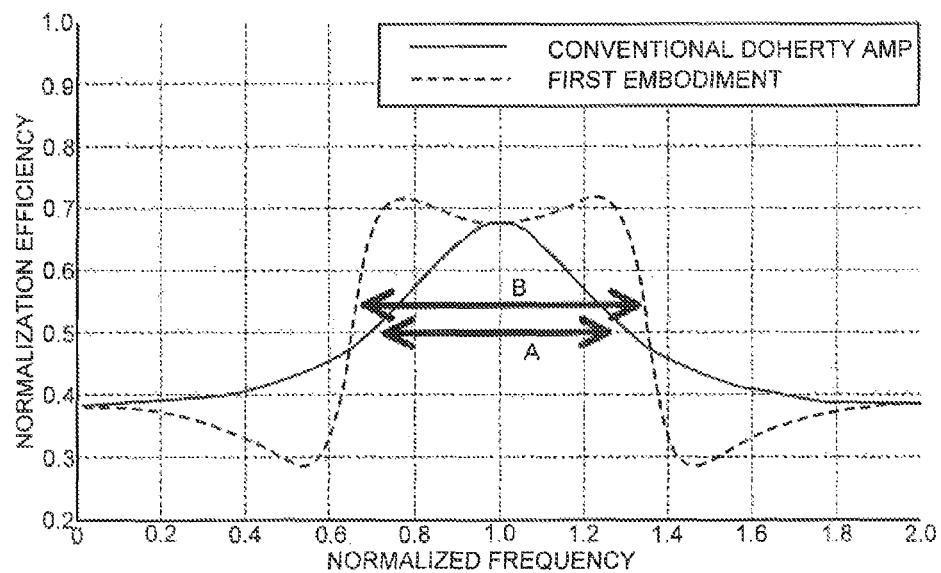
FIG. 3 is a chart illustrating a frequency characteristic of the amplifying device according to the first embodiment.

In the circuit configuration illustrated in FIG. 1, as the first and second matching circuits 14, 24, those having a sufficiently wide-band characteristic are used, and the electrical length of the first output circuit 16 is set to 90 degrees and the electrical length of the second output circuit 26 is set to 180 degrees. The biases are adjusted so that the first amplifier 12 is operated in class B and the second amplifier 22 is operated in class C. FIG. 3 illustrates modulated wave efficiency in such a case.

As illustrated in FIG. 3, by the circuit configuration illustrated in FIG. 1, that is, by realizing the characteristics illustrated in FIG. 2 by setting the electrical lengths of the first and second output circuits 16, 26 different, and further by designing the first and second matching circuits 14, 24 so as to be operatable over a sufficiently wide band, it is possible to achieve 50% efficiency or more at the time when the modulated wave whose normalized frequency is in a 0.7 to 1.3 range is input (B in FIG. 3). Consequently, it can be confirmed that this circuit is capable of realizing a wider band operation than a conventional Doherty amplifier (A in FIG. 3).

Note that, in the above-described embodiment, the matching circuits have wide-band characteristics, but this is not restrictive. That is, they may have characteristics that the matching is obtained in any two discrete frequency bands or more. For example, in an amplifying device having the characteristic in FIG. 3, by assembling a matching circuit realizing the matching to a desired impedance only when the normalized frequency is 0.7, 1.0, and 1.3, it is possible to obtain an amplifier realizing a high-efficiency operation in three discrete frequency bands. The specific frequencies at this time may be selected from frequency regions where high efficiency is obtained in the broken line part in FIG. 3.

(Second Embodiment)

Figure 4:
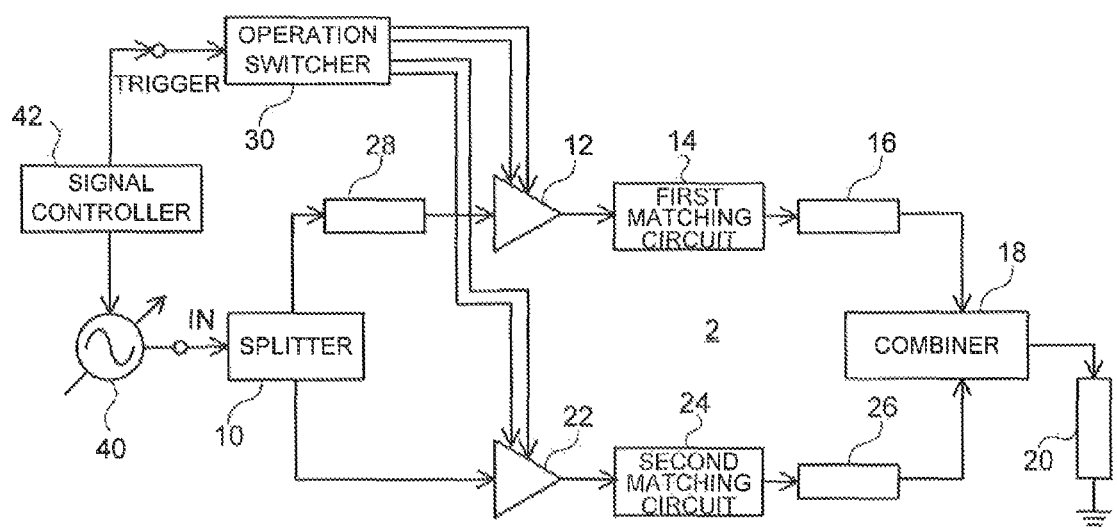
FIG. 4 is a block diagram illustrating the structure of an amplifying device according to a second embodiment.

Next, a second embodiment will be described in detail with reference to FIG. 4. As illustrated in FIG. 4, an amplifying device 2 of this embodiment has a structure in which an operation switcher 30 is further provided in the amplifying device 1 of the first embodiment illustrated in FIG. 1. In the description below, the same elements as those of the first embodiment will be denoted by the same reference signs and redundant description thereof will be omitted.

The amplifying device 2 of this embodiment is capable of switching operating points of a first amplifier 12 and a second amplifier 22 (their operating classes, operating voltages of amplifying elements, and so on) when a carrier frequency falls out of a specific range. As a result of the switching, operation states of the respective amplifiers are changed so that the amplifier which has been operating as a peaking amplifier becomes a carrier amplifier which operates to amplify the whole input signal and the amplifier which has been operating as the carrier amplifier becomes the peaking amplifier which operates to amplify a peak signal.

The operation switcher 30 illustrated in FIG. 4 replaces the operating classes of the first amplifier 12 and the second amplifier 22 by each other when the frequency (carrier frequency) that the amplifying device 2 amplifies is changed to a certain degree or more. Concretely, the operation switcher 30 controls biases to the first and second amplifiers 12, 22 to change their operating classes. In addition, when drain voltages of the first and second amplifiers 12, 22 are different, the operation switcher 30 also switches their drain voltages.

The operation switcher 30 may perform the switching control by externally receiving a trigger indicating a frequency change of an input signal, or may externally receive a frequency value to determine whether to perform the switching, based on the frequency value. Alternatively, with a frequency detecting part which detects the frequency of the input signal of the amplifying device 2 being further provided, the operation switcher 30 may perform the switching control based on the detection result. In the example illustrated in FIG. 4, a signal controller 42 generates a trigger signal indicating the frequency change of the signal to be amplified and gives the trigger signal to the operation switcher 30. The switching of the operating classes of the first and second amplifiers 12, 22 by the operation switcher 30 can be realized by replacing the biases (for example, gate voltages) to their amplifying elements by each other. At this time, the operation switcher 30 may finely adjust bias values as it performs the switching. In addition, drain voltages may be finely adjusted.

(Operation Example of Second Embodiment)

Figure 5:
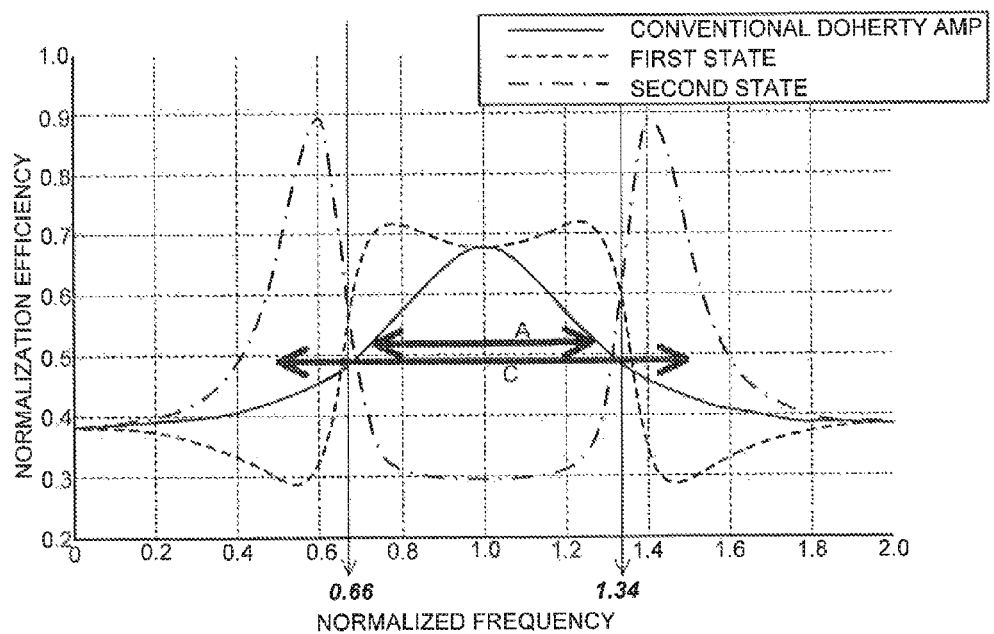
FIG. 5 is a chart illustrating a frequency characteristic of the amplifying device according to the second embodiment.

In the configuration illustrated in FIG. 4, the operation switcher 30 is structured to be capable of switching between two operation states, that is, a first state (the same operation state as that of the first embodiment) and a second state (operation state in which the operating classes of the first and second amplifiers in the first state are replaced by each other). Concretely, the operation switcher 30 is structured to supply biases to the respective amplifiers so that, in the first state, the first amplifier 12 is operated in class B and the second amplifier 22 is operated in class C, and in the second state, the second amplifier 22 is operated in class B and the first amplifier 12 is operated in class C. FIG. 5 illustrates a frequency characteristic of the amplifying device 2 in such a case.

As illustrated in FIG. 5, it is seen that by the operation switcher 30 switching between the first state and the second state when a normalized frequency normalized by a carrier frequency becomes 0.66 or 1.34, it is possible to realize a high-efficiency operation with 0.6 normalization efficiency or more as the whole amplifying device 2 over the normalized frequencies 0.5 to 1.5. That is, by switching the operating classes of the first and second amplifiers according to the frequency of the signal to be amplified, it is possible to widen a frequency bandwidth in which the whole amplifying device operates highly efficiently.

Note that, in the second embodiment, transmission lines forming a first and a second output circuit 16, 26 need not be formed by lines having a single characteristic impedance as in the first embodiment. When necessary, transmission lines having different characteristic impedances may be assembled to form the first and second output circuits 16, 26.

Further, similarly to the first embodiment, matching circuits are not limited to have a wide band characteristic but may have a characteristic so that the matching can be obtained in any two discrete frequency bands or more. For example, in an amplifying device having the characteristic in FIG. 5, by assembling a matching circuit achieving the matching to a desired impedance only when the normalized frequency is 0.5, 1.0, 1.5, it is possible to realize an amplifier realizing a high-efficiency operation in three discrete frequencies. The specific frequencies at this time may be selected from frequency regions where high efficiency is obtained in the broken line part in FIG. 5 or may be selected from the dashed line part in FIG. 5. Alternatively, the frequencies may be selected from the combination of the both frequency bands.

(Third Embodiment)

Figure 6:
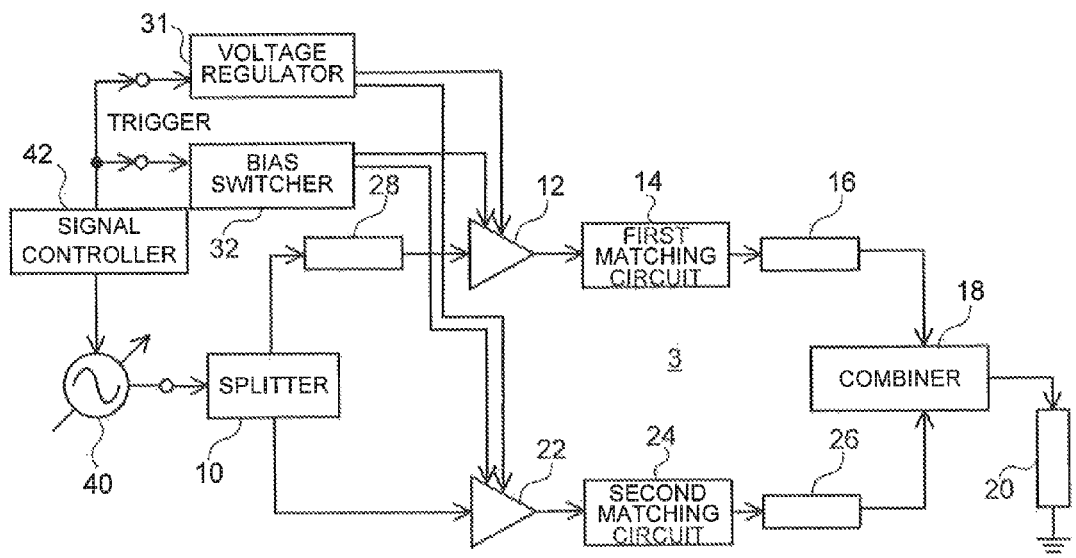
FIG. 6 is a block diagram illustrating the structure of an amplifying device according to a third embodiment.

Next, a third embodiment will be described in detail with reference to FIG. 6 to FIG. 8. As illustrated in FIG. 6, in an amplifying device 3 of this embodiment, the operation switcher 30 in the amplifying device 2 of the second embodiment illustrated in FIG. 4 is replaced by a voltage regulator 31 and a bias switcher 32. In the description below, the same elements as those of the second embodiment illustrated in FIG. 4 will be denoted by the same reference signs, and redundant description thereof will be omitted.

The amplifying device 3 of this embodiment also operates so that, when a carrier frequency falls out of a specific range, operating classes of a first amplifier 12 and a second amplifier 22 are replaced by each other. Then, operation states of the amplifiers are changed so that the amplifier which has been operating as a peaking amplifier becomes a carrier amplifier which operates to amplify the whole input signal and the amplifier which has been operating as the carrier amplifier becomes the peaking amplifier which operates to amplify a peak signal.

The voltage regulator 31 has a function of adjusting drain voltages of the first and second amplifiers 12, 22 so that back off amounts corresponding to respective carrier frequencies become equal. Further, the bias switcher 32, similarly to the operation switcher 30 in the second embodiment, switches operating classes of the first amplifier 12 and the second amplifier 22 according to the carrier frequency. That is, in the amplifying device 2 of the second embodiment, the drain voltages and the operating classes of the amplifying elements of the amplifiers are switched together, but in the amplifying device 3 of the third embodiment, the adjustment of the drain voltage and the adjustment of the operating class are performed separately.

With such a structure, it becomes possible to make an output power constant while realizing a high-efficiency operation by, for example, equalizing saturation powers. Concretely, by the voltage regulator 31 adjusting the drain voltages of the amplifying elements of the first amplifier 12 and the second amplifier 22, it is possible to equalize the back-off of an average output power to the saturation power to realize a high-efficiency operation even when the saturation powers in respective frequency regions differ.

Figure 7:
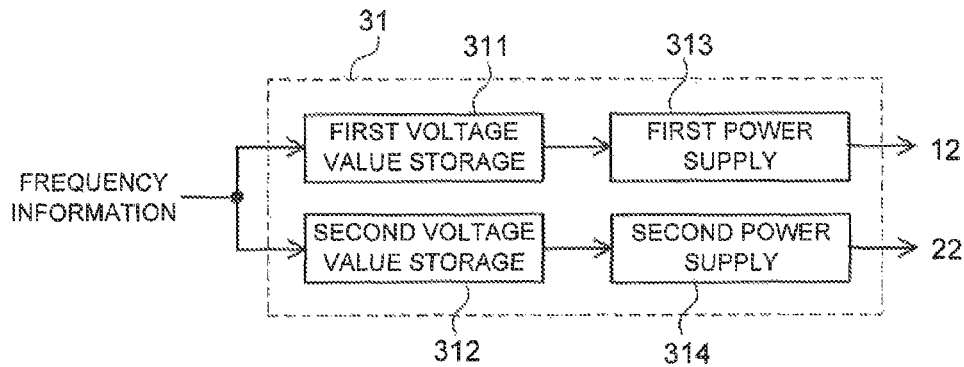
FIG. 7 is a block diagram illustrating the structure of a voltage regulator of the third embodiment.

As illustrated in FIG. 7, the voltage regulator 31 of this embodiment includes a first and a second voltage value storage 311, 312 which store drain voltage set values corresponding to the signal frequencies in advance and output designated voltage values based on a signal indicating carrier frequency information. The voltages stored in the first voltage value storing part 311 and the second voltage value storage 312 are set to values so that, for example, prescribed power is output under a back-off condition from the saturation power that is the same for each frequency. In a system which outputs the same power in a used frequency band, in consideration that the saturation power differs when the normalized frequency is 1 and when it is 0.5, it is necessary to prescribe the output power based on the lower saturation power, and therefore, a back-off level becomes large in to frequency where the saturation power is high, resulting in low efficiency. In such a case, by lowering the drain voltage for the frequency where the saturation power is high, the operation with the constant back-off level is possible, which can improve efficiency.

Further, the voltage regulator 31 includes a first and a second power supply 313, 314 which operate as constant voltage sources having drain voltage values designated by output values of the first and second voltage value storages 311, 312 which are based on the frequency information, to supply voltages with the relevant voltage values to the first and second amplifiers 12, 22. The signal controller 42 gives the frequency information of a signal to be amplified to the voltage regulator 31. With such a structure, the amplifying device 3 of this embodiment can equalize the saturation powers according to the carrier frequency to make the back-off constant, and it is possible to make the output power constant while realizing a high-efficiency operation.

In this example, the first and second voltage value storages 311, 312 each have one voltage value corresponding to the carrier frequency or more, but it should be noted that they may have voltage values corresponding to, for example, an operating environment (for example, temperature) in addition to the carrier frequency. In this case, if voltage values corresponding to three temperatures per each of three frequencies are stored in each of the first and second voltage value storages 311, 312, totally nine voltage values are stored. Then, by giving information on the carrier frequency and the temperature to the first and second voltage value storages 311, 312, it is possible to output one corresponding voltage value out of the nine voltage values.

Figure 8:
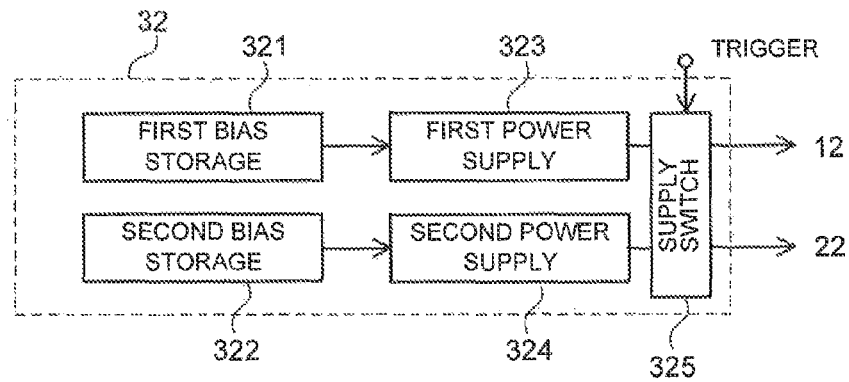
FIG. 8 is a diagram illustrating the structure of a bias switcher of the third embodiment.

Further, as illustrated in FIG. 8, the bias switcher 32 of this embodiment includes a first bias storage part 321 storing a bias value with which the first and second amplifiers 12, 22 are operated as the carrier amplifier, and a second bias storage part 322 storing a bias value with which the first and second amplifiers 12, 22 are operated as the peaking amplifier. Further, the bias switcher 32 includes a first and a second power supply 323, 324 which generate bias values of the first and second amplifiers 12, 22 based on the bias values stored in the first and second bias storage parts 321, 322. Further, the bias switcher 32 includes a supply switching 325 which switches supply destinations of the biases generated by the first and second power supplies 323, 324 between the first and second amplifiers 12, 22 based on a trigger indicating a frequency change of an input signal, carrier frequency information, or the like which is given externally.

The supply switching 325 decides operating classes of the first and second amplifiers 12, 22 according to the trigger signal, the carrier frequency, or the like which is externally given, and switches the supply destinations of the bias signals generated by the first and second power supplies 323, 324. In the example illustrated in FIG. 6 and FIG. 8, the signal controller 42 generates a trigger signal indicating the frequency change of the signal to be amplified and gives it to the bias switcher 32.

For example, the supply switching 325 operates so that, when the normalized frequency in FIG. 5 is 0.66 to 1.34, an output of the first power supply 323 and the first amplifier 12 are connected and an output of the second power supply 324 and the second amplifier 22 are connected, and when the normalized frequency has other values, the output of the first power supply 323 and the second amplifier 22 are connected and the output of the second power supply 324 and the first amplifier 12 are connected. With such a structure, by switching the operating classes of the first and second amplifiers according to the frequency of the signal to be amplified, it is possible to widen a frequency bandwidth of the whole amplifying device. Incidentally, the supply switching 325 may receive the frequency information on the carrier frequency to determine the operating classes of the first and second amplifiers.

Figure 9:
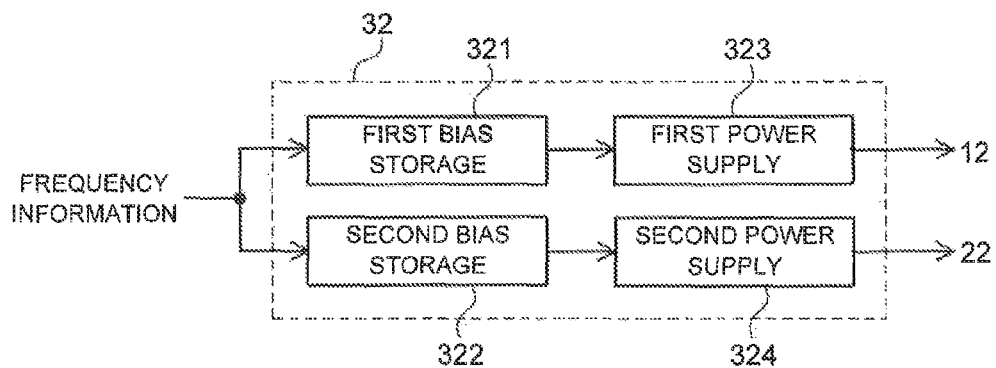
FIG. 9 is a diagram illustrating a modification example of the bias switcher of the third embodiment.

Incidentally, since a characteristic of an amplifier changes according to a frequency, the frequency information instead of the trigger may be input to the bias switcher 32 as illustrated in FIG. 9. That is, the bias voltage values corresponding to a plurality of frequencies of the first amplifier 12 and the second amplifier 22 are stored in the first bias storage part 321 and the second bias storage part 322 in advance. Then, the voltage values read from the first bias storage part and the second bias storage part may be set in the first power supply and the second power supply according to the input frequency information, and corresponding voltages may be output. In this case, since the bias voltages corresponding to the respective signal frequencies for the first amplifier 12 are recorded in the first bias storage part 321 and the bias voltages corresponding to the respective signal frequencies for the second amplifier 22 are recorded in the second bias storage part 322, the supply switching 325 is not necessary, but voltage values with which the operating classes are switched are stored in the storage parts so that the same effect as that of the supply switching can be obtained.

In the above-described embodiments, the examples where the matching circuits are provided only on the output sides of the first and second amplifiers are described, but this is not restrictive. The wide-band matching circuits may be provided on the input sides of the amplifiers. In this case, the matching circuits on the input sides of the amplifiers also realize the harmonic matching, similarly to the first and second matching circuits 14, 24. Further, in the description of the above embodiments, the Doherty amplifier using the two amplifiers is taken as an example, but this is not restrictive either. That is, the concept of the embodiments is applicable also to a structure such as a Doherty amplifier having three stages or more.

Further, in the above-described embodiments, the splitter 10 distributes the input signal to the first amplifier 12 and the second amplifier 22, but this is not restrictive. Instead of using the splitter, two kinds of signals, namely, an input signal to the first amplifier 12 and an input signal to the second amplifier 22 may be directly received from a signal source.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifying device comprising:
   a first amplifier to amplify a first signal component of an input signal;
   a first output circuit having an input connected to an output of the first amplifier, the first output circuit converting an impedance seen from an output of the first output circuit so as to make the converted impedance seen from the first amplifier;
   a second amplifier to amplify a second signal component of the input signal with a bias deeper than a bias of the first amplifier;
   a second output circuit having an input connected to an output of the second amplifier, the second output circuit having a longer electrical length than an electric length of the first output circuit, the second output circuit converting an impedance seen from an output of the second output circuit so as to make the converted impedance seen from the second amplifier;

a combiner to combine the first signal component amplified by the first amplifier and the second signal component amplified by the second amplifier, and an operation controller to switch operating classes of the first amplifier and the second amplifier according to a frequency of the input signal.

2. The amplifying device of claim 1, further comprising:
a first matching circuit disposed between the first amplifier and the first output circuit, the first matching circuit having a 1% fractional bandwidth or more; and
a second matching circuit disposed between the second amplifier and the second output circuit, the second matching circuit having a 1% fractional bandwidth or more.

3. The amplifying device of claim 2,
wherein the first matching circuit and the second matching circuit are capable of performing the matching in predetermined two frequencies or more.

4. The amplifying device of claim 2, further comprising an operation controller to control operating points of the first amplifier and the second amplifier according to a frequency of the input signal.

5. The amplifying device of claim 2, further comprising a transmission line connected to an input of the first amplifier, the transmission line having an electrical length equal to a difference between the electrical lengths of the first output circuit and the second output circuit.

6. The amplifying device of claim 2,
wherein the first matching circuit and the second matching circuit are capable of performing matching in predetermined two frequencies or more.

7. The amplifying device of claim 2,
wherein the first output circuit and the second output circuit each include a plurality of impedance converting circuits.

8. The amplifying device of claim 2, further comprising a splitter to split the input signal into the first signal component and the second signal component.

9. The amplifying device of claim 2, further comprising:
a third matching circuit connected to an input of the first amplifier, the third matching circuit having a 1% fractional bandwidth or more; and
a fourth matching circuit connected to an input of the second amplifier, the fourth matching circuit having a 1% fractional bandwidth or more.

10. A transmitting device comprising:
the amplifying device according to claim 2; and
a signal generator to generate a signal with a predetermined frequency as the input signal to supply the signal to the amplifying device.

11. The transmitting device according to claim 10, further comprising:
a signal controller to control the signal generator to control the frequency of the input signal and generate a trigger signal according to the controlled frequency; and
an operation controller to control operating points of the first amplifier and the second amplifier according to a frequency of the input signal based on the trigger signal.

12. The amplifying device of claim 1,
wherein the operation controller controls operating voltages of amplifying elements of the first amplifier and the second amplifier to switch the operation classes according to the frequency of the input signal.

13. The amplifying device of claim 1, further comprising a transmission line connected to an input of the first amplifier, the transmission line having an electrical length equal to a difference between the electrical lengths of the first output circuit and the second output circuit.

14. The amplifying device of claim 1,
wherein the first output circuit and the second output circuit each include a plurality of impedance converting circuits.

15. The amplifying device of claim 1, further comprising a splitter to split the input signal into the first signal component and the second signal component.

16. The amplifying device of claim 1, further comprising:
a first matching circuit connected to an input of the first amplifier, the third matching circuit having a 1% fractional bandwidth or more; and
a second matching circuit connected to an input of the second amplifier, the fourth matching circuit having a 1% fractional bandwidth or more.

17. A transmitting device comprising:
the amplifying device according to claim 1; and
a signal generator to generate a signal with a predetermined frequency as the input signal to supply the signal to the amplifying device.

18. The transmitting device of claim 17, further comprising:
a signal controller to control the signal generator to control the frequency of the input signal and generate a trigger signal according to the controlled frequency; and
an operation controller to control operating points of the first amplifier and the second amplifier according to a frequency of the input signal based on the trigger signal.

* * * * *